(12) United States Patent
Putzeys

(10) Patent No.: US 8,289,097 B2
(45) Date of Patent: Oct. 16, 2012

(54) METHOD AND CONTROL CIRCUIT FOR CONTROLLING PULSE WIDTH MODULATION

(75) Inventor: Bruno Johan Georges Putzeys, Rotselaar (BE)

(73) Assignee: Hypex Electronics B.V., Groningen (NL)

( * ) Notice: Subject to any disclaimer, the term of this patent is extended or adjusted under 35 U.S.C. 154(b) by 3 days.

(21) Appl. No.: 12/736,633

(22) PCT Filed: Apr. 22, 2009

(86) PCT No.: PCT/NL2009/000100
§ 371 (c)(1),
(2), (4) Date: Dec. 27, 2010

(87) PCT Pub. No.: WO2009/131440
PCT Pub. Date: Oct. 29, 2009

(65) Prior Publication Data
US 2011/0095836 A1    Apr. 28, 2011

(30) Foreign Application Priority Data
Apr. 23, 2008  (NL) .................................... 1035333

(51) Int. Cl.
*H03K 7/00* (2006.01)
(52) U.S. Cl. .......... 332/106; 332/109; 381/120; 330/10; 330/207 A
(58) Field of Classification Search .................. 332/106, 332/109; 381/120; 331/10, 207 A
See application file for complete search history.

(56) References Cited

U.S. PATENT DOCUMENTS

| 4,504,793 A | 3/1985 | Yokoyama |
| 5,548,286 A | 8/1996 | Craven |
| 5,898,340 A | 4/1999 | Chatterjee |
| 5,933,453 A | 8/1999 | Lewison |
| 6,339,360 B1 | 1/2002 | Santillano |
| 6,342,822 B1 * | 1/2002 | So .................................. 332/109 |

(Continued)

FOREIGN PATENT DOCUMENTS
EP    1104094    5/2001
(Continued)

OTHER PUBLICATIONS

International Search Report for PCT Appln. No. PCT/IB03/04795 mailed Feb. 9, 2004.

(Continued)

*Primary Examiner* — Arnold Kinkead
(74) *Attorney, Agent, or Firm* — Davidson Berguist Jackson & Gowdey LLP

(57) ABSTRACT

The invention provides a method and a modulation circuit for pulse width modulation with feedback, wherein a pulse width modulated signal is provided on the basis of an input signal and a reference signal that is periodic and has a reference frequency. The pulse width modulated signal is provided in that an output signal is switched from a first voltage level to a second voltage level in dependence on a comparison between the input signal and the reference signal at least once in every cycle of the reference signal, and in that at least once at a fixed moment in time in every cycle the pulse width modulated signal is switched from the second voltage level to the first voltage level. Furthermore, a periodic correction signal is added for compensation of the switching from the second voltage level to the first voltage level in the pulse width modulated signal.

12 Claims, 3 Drawing Sheets

U.S. PATENT DOCUMENTS

| | | |
|---|---|---|
| 6,414,613 B1 | 7/2002 | Midya et al. |
| 7,002,406 B2 * | 2/2006 | Risbo et al. .................... 330/10 |
| 2004/0046680 A1 | 3/2004 | Masuda et al. |
| 2006/0158246 A1 | 7/2006 | Lee |

FOREIGN PATENT DOCUMENTS

| | | |
|---|---|---|
| WO | WO 02/078179 | 10/2002 |
| WO | WO 2004/049561 | 6/2004 |
| WO | WO 2006/030373 | 3/2006 |

OTHER PUBLICATIONS

International Search Report for PCT Appln. No. PCT/NL2009/000100 mailed Nov. 5, 2005.

* cited by examiner

METHOD AND CONTROL CIRCUIT FOR CONTROLLING PULSE WIDTH MODULATION

FIELD OF THE INVENTION

The present invention relates to a method of providing pulse width modulation, comprising the steps of providing a pulse width modulated signal based on an input signal and a reference signal, feeding back the pulse width modulated signal to the input signal, and filtering at least the pulse width modulated signal by means of a loop filter, said reference signal being a periodical reference signal having a reference frequency.

The invention further relates to a control circuit for controlling pulse width modulation suitable for use in a method as described above.

BACKGROUND OF THE INVENTION

Pulse width modulation is a technique whereby an analog signal can be sampled into a signal having two states (binary) by means of comparison of the analog signal with a reference signal. Pulse width modulation is used inter alia in class D amplifiers for audio applications. Class D amplifiers are known for their high power efficiency (low power losses) and relatively simple circuitry. The simple mechanical construction of these amplifiers has the result that they can be designed to be small and compact. Class D amplifiers are based on the principle that an incoming audio signal is compared with a periodic reference signal that comprises rising and falling edges in each cycle. A switched amplification is used herein such that an output signal of the connected amplifier unit is switched to a first voltage level when the voltage value of the audio signal is lower than the voltage value of the reference signal, whereas the output signal is switched to a second voltage level when the voltage of the audio signal is higher than the voltage of the reference signal.

A standard control circuit for pulse width modulation of a class D amplifier according to the prior art is schematically depicted in FIG. 1. FIG. 1 shows a circuit 1 based on a switched amplifier unit 9. An input signal 3 is applied to the circuit and is provided along with a reference signal 4 to the switched amplifier unit 9 via inputs 7 and 8. The switched amplifier unit 9 compares the voltage values between inputs 7 and 8. If the input signal has a voltage value that is higher than the voltage value of the reference signal, here offered via input 8, a high voltage signal VH 10 will be provided at the output of the amplifier unit. If the reference voltage Vref at the input 8 is higher than the voltage value Vc at input 7 of the switched amplifier circuit, however, a low voltage level VL 11 will be produced at the output of the switched amplifier 9. It is schematically indicated in FIG. 1 in the form of an adder unit 15 that the switched amplifier unit 9 adds a disturbance term Ve to the output signal. The output signal at an output 18 of the circuit is referenced Vo.

The circuit 1 is further characterized in that it comprises a feedback loop 20 which feeds the output voltage Vo back to the input 3 of the circuit, thus adding this output voltage Vo to the input signal Vi, which is schematically indicated as an adder unit 21. The feedback of the output signal Vo to the input of the circuit and the combination thereof with the input signal Vi is important for correcting various imperfections (collectively represented as a disturbance term Ve), in particular as regards the timing and phase in the power stage. An element 22 schematically indicates the transfer function H(s) of the circuit. This comprises both the transfer function of the forward path and that of the feedback path (the feedback filter). This element will be denoted the loop filter 22 hereinafter.

A problem of pulse width modulation circuits with feedback, such as the circuit 1 shown in FIG. 1, is the intermodulation between the input signal and the feedback signal. The output signal Vo consists of the desired average output voltage, disturbances, and a major switching residue, and accordingly comprises many high-frequency components, as will be discussed in more detail further below. The feedback signal consists of the complete pulse width modulated signal Vo. The feedback signal Vo is joined together with the input signal Vi and, after passing through the loop filter 22, is offered to the switched comparator amplifier 9 as a signal Vc. The loop filter 22 causes the signal Vo+Vi to be linearly deformed and changes the phase and/or amplitude of the spectral components of the signal Vo+Vi. The original rectilinear waveform, with regular rectilinear edges, will thus come to comprise (curved) line sections having slope angles that do not increase or decrease. The first derivative d(Vo+Vi)/dt is now no longer constant at the area of the comparator but will change in dependence on the modulation index (duty cycle). The switched amplifier 9 will deform in a non-linear manner, i.e. will add harmonics as a result of the curved edges of the signal Vc owing to the linear deformation of the loop filter 22.

The moment when in each cycle the output signal of the switched amplifier unit 9 switches from the first voltage level, for example VH, to the second voltage level, for example VL, is determined by the relative voltage levels of the reference voltage on the one hand and the voltage of the input signal on the other hand. The switch-over point between two voltage levels in the output signal Vo lies at the point of intersection of the edges of the reference signal Vref at input 8 and the signal Vc at input 7 of the switched amplifier. Vc has curved edges which in an ideal model ought to be straight and regular. The points of intersection between the edges of Vc and the edges of Vref accordingly do not lie in the locations where they should ideally be. The switch-over moment from the one voltage level to the other voltage level has thus become dependent on the deformation in the signal Vc, i.e. it is unknown. When a triangular signal is used as the reference signal (this is not the case in FIG. 1), the switch-over point from the first voltage level to the second voltage level, and back from the second voltage level to the first voltage level, will be unknown in both cases. The eventual output signal Vo accordingly is also deformed.

The non-linear behaviour of the circuit is aggravated by the fact that the spectrum of the output signal Vo varies continually with the modulation. The spectral properties of the output signal Vo can be explained as follows. Given an input signal Vi with a comparatively high voltage level, the output signal Vo will be at the second voltage level for a relatively short period of time in each cycle and will be at the first voltage level for the remaining part of each cycle. If on the other hand the voltage value of the input voltage Vi is comparatively low, the output voltage Vo will be at the first voltage level for a relatively short period of time in each cycle and will be at the second voltage level for a relatively long period of time in each cycle. The time during which the output signal is at one of the two voltage levels accordingly depends strongly on the voltage value of the input signal. This implies that the spectrum of the output signal, including the harmonics, will vary strongly with the modulation.

To reduce the problems of non-linearity, it has been proposed not to use a triangular reference signal, but instead, for example, a sawtooth signal. The use of a sawtooth signal in fact has the advantage that one of the edges of the reference signal falls (or rises) so steeply that the switch-over moment at the output of the switched amplifier 9 from the one voltage level (for example VH) to the other voltage level (for example VL) is substantially defined. This, however, does not solve the problem because it does not offer a solution to the spectrum of the output signal varying with the modulation.

International patent application WO/2006/030373 deals with the problem outlined above and also states that the use of a sawtooth reference signal has the result that at least one of the edges of each cycle of the periodic signal, i.e. the steep edge, does not carry any information. To improve the situation, the cited document proposes, for the input signal applied to the switched amplifier unit, an addition of an artificially created sawtooth frequency signal, to be regarded as a feedback signal, to this input signal upstream of the switched amplifier unit. The composite signal is then fed back to the start of the forward path, i.e. upstream of the filter, before being processed in the switched amplifier unit. In this switched amplifier unit the incoming composite and fed-back signal is compared with "0" in order to determine the zero passages. Switch-over points from the first voltage level to the second voltage level, and back from the second voltage level to the first voltage level, in each cycle are determined from the zero passages of the obtained composite and fed-back signal.

The effect of this method is that the deviation of the information stored in the pulse width modulated signal, i.e. the switching residue, is comparatively constant. The influence of the filter on the output signal is comparatively small as a result. A major disadvantage of this method is, however, that an assumption is made as to the signal that is to be fed back from the output of the pulse width modulation unit to the input signal. This feedback signal is a simulated one and is offered to the input signal without the switched amplifier 9 and the output filter (if present, not shown in FIG. 1) playing any part in the generation of this feedback signal. The final pulse width modulated signal is accordingly not used for the feedback in any way whatsoever, and such a method can only be implemented such that no new disturbances are introduced if the switched amplifier unit 9 and the pulse width modulation taking place therein are ideal. However, the reality is different: the operation of the switched amplifier unit 9 is not ideal, as is indicated schematically in FIG. 1, a component Ve being present in the output signal Vo at output 18 which has been added to the output signal of the switched amplifier unit 9 (adder unit 15). If this disturbance component Ve 14 is not known, the method described in WO/2006/030373 cannot lead to satisfactory results.

A further problem of the method described in WO/2006/030373 is that it is not easy to implement in that it uses a sawtooth generator immediately in front of the switched amplifier unit for providing the feedback signal. It is not simple to generate a pure sawtooth, which is why a digital sawtooth generator is used in WO/2006/030373.

SUMMARY OF THE INVENTION

It is an object of the present invention to provide a pulse width modulation loop which is of a simple construction, which can be fully analog if so desired, and which disturbs the input signal to be processed as little as possible.

The invention for this purpose offers a method of providing pulse width modulation, comprising the steps of providing a pulse width modulated signal based on an input signal and a reference signal, feeding back the pulse width modulated signal to the input signal, and filtering at least the pulse width modulated signal by means of a loop filter, said reference signal being a periodical reference signal having a reference frequency, wherein the step of providing the pulse width modulated signal comprises: switching over the pulse width modulated signal from a first voltage level to a second voltage level in dependence on a comparison between the input signal and the reference signal at least once in every cycle of the reference signal; and switching over the pulse width modulated signal from the second voltage level to the first voltage level at least once at a fixed moment in every cycle of the reference signal; wherein said method further comprises a step of adding a periodic correction signal such that an operational frequency of said correction signal is attuned to said reference frequency; and wherein said correction signal comprises a voltage step that coincides with and is oppositely directed to the switch-over from the second voltage level to the first voltage level of the pulse width modulated signal so as to compensate at least in part for said switch-over.

The invention is based on the insight that the switch-over of the pulse width modulated output signal from the second voltage level to the first voltage level, which takes place at a fixed moment in time during each cycle and accordingly does not contain any information, can be removed from the pulse width modulated signal by applying a correction signal comprising a compensatory voltage step that is oppositely directed to the voltage step from the second voltage level to the first voltage level and coincides therewith. The removal from the pulse width modulated signal of this voltage step which contains no information, makes the spectrum of the pulse width modulated signal smaller while the signal components associated with a voltage step containing no information are cancelled. The high-frequency part of the spectrum of the fed-back signal becomes much less variable as a result of this, which manifests itself in en reduction in the amount of intermodulation between the reference signal and the high-frequency part of the fed-back signal, so that less disturbance will occur.

A further advantage of this method is that the feedback signal that is added to the input signal comprises the actual pulse width modulated signal that has been corrected for the voltage steps that carry no information. The feedback signal applied to the input accordingly is a "genuine" feedback signal derived from the output of the circuit, and is not idealised in some way or another. This method provides a switching residue that has been made constant and that is influenced by the filter to a much lesser degree, so that the quality of the output signal is considerably improved.

The improvement is most significant when the amplitude of the periodic correction signal is attuned to a difference between the first and the second voltage level. It is in fact possible in this manner to compensate fully for the voltage step not containing any information at the switch-over point from the second to the first voltage level and to remove said step from the feedback signal.

Preferably, and according to a further embodiment, the correction signal also comprises a sawtooth signal. The advantage of this is that the sloping edges of the sawtooth signal can compensate for the offset of the output signal caused by the compensation of the edges from the second voltage level to the first voltage level, so that the output signal can vary constantly around, for example, an equilibrium voltage. The word "offset" here denotes the deviation of the average voltage of the output signal from the desired equilibrium voltage. If the voltage steps (i.e. those without information) in the pulse width modulated signal are compensated for, the output signal will in principle only comprise voltage steps in "one direction", for example an upward voltage direction, with a voltage difference equal to the voltage difference between the first voltage level and the second voltage level. A signal then arises, for example, which has a stepped shape whose voltage value (theoretically) becomes ever higher. This can be compensated in that a sawtooth signal is used as a correction signal, wherein the sloping edges of the sawtooth signal return the voltage value of the output signal gradually to the first voltage level.

The correction signal may be applied to the circuit, for example, immediately behind the switched amplifier unit in the pulse width modulation loop. This would be a good starting point in an ideal situation because the edges of the pulse width modulated signal that contain no information could be removed immediately behind the switched amplifier unit without these edges affecting the behaviour of the circuit as a result of transfer functions in the remaining circuit or the feedback loop. In many cases, however, there are other components, for example an output filter, arranged between the output of the pulse width modulation loop and the output of the switched amplifier. If the correction signal is applied immediately behind the switched amplifier, it will no longer be possible in the output filter to distinguish the noise originating from the correction signal from any noise already present in the pulse width modulated signal. Since the output filter will try to minimise the amount of noise in the feedback signal, the noise present in the correction signal will be present in mirrored form in the pulse width modulated output signal.

The correction signal may therefore alternatively be added to the pulse width modulated signal, for example, behind the output filter, for example in the feedback loop. This will only be successful, however, if the correction signal is compensated with respect to the transfer function of the output filter. This principle can be applied not only to the output filter, but also to al other transfer functions of components present in the feedback loop or the forward path between the output of the switched amplifier and the location where the correction signal is added. In this manner the correction signal may thus be added anywhere in the circuit, provided it is compensated for deformations caused by transfer functions of components situated between the output of the switched amplifier unit and the addition point, viewed over the feedback loop.

According to a preferred embodiment, the invention therefore provides a method which is implemented by means of a circuit comprising one or more operational components, wherein the correction signal is compensated for deformation caused by a transfer function of at least one of said components. In this way the correction signal can be added behind the output filter, in the feedback loop, at the input of the forward path provided that at the same time a compensation is provided for the transfer function of the feedback loop, at the signal input of the switched amplifier provided that a compensation is provided for all preceding transfer functions starting from the output of the switched amplifier along the output filter via the feedback loop over the forward path up to the input of the switched amplifier, etc.

An important recognition of the invention is that the correction signal may also be offered to the inverted input of the switched amplifier unit which is used for offering the reference signal. The correction signal should in that case not only be compensated for all transfer functions of the output filter, the feedback loop, and the forward path, but also be inverted. The importance of this recognition is that the quality of the pulse width modulated output signal of a pulse width modulation loop, such as a class D amplifier, can be substantially improved in that the reference signal is "disturbed" by a correction signal. Offering a reference signal that has been "disturbed" in this manner to the reference input of the switched amplifier unit renders it possible to work with a standard pulse width modulation circuit. Thanks to this recognition, the invention can be directly implemented in an analog circuit without the necessity of adapting the latter or of using additional components such as those used in the prior art. The reference signal has as it were been adapted in advance to the non-ideal conditions in the circuit, so that these have hardly any influence on the pulse width modulated signal.

The invention may be applied in principle to any pulse width modulation circuit as long as the pulse width modulated signal comprises a sharp edge or voltage step of which the moment of occurrence in the cycle is fixedly defined, can be determined, or is known. This advantage may be achieved in a simple manner, for example, through the use of a reference signal that has a fixed switch-over point from a first voltage level to a second voltage level such as, for example, a sawtooth signal. Other possible reference signals may also be used as long as they have the same effect. Those skilled in the art will be capable of identifying suitable similar signals that may be used as reference signals on the basis of the present description.

The invention was described above with reference to the use of a reference signal and a correction signal. If the correction signal is directly applied to that input of the switched amplifier unit to which also the reference signal is applied, as in the embodiment described above, and the reference signal is combined with the correction signal, there will obviously no longer be a strict separation between the correction signal and the reference signal. In this case it may also be referred to as a suitable correction of the reference signal in view of the transfer function of the pulse width modulation loop with a compensation of the fixed switch-over point in the pulse width modulated signal.

The above was based on a single circuit with a single reference signal. The reference signal may alternatively be composed of a plurality of reference signal components, wherein each reference signal component may be associated with a suitable correction signal component. The invention accordingly also covers an embodiment in which the reference signal is a combination of a plurality of reference signal components, and wherein the correction signal is a combination of a plurality of correction signal components. The number of reference signal components may then be equal to the number of correction signal components.

According to a second aspect of the invention, the latter provides a modulation circuit for pulse width modulation suitable for use in a method according to the first aspect, said modulation circuit comprising a switched amplifier unit for switching between a first and a second voltage level on the basis of a comparison of an input signal with a reference signal so as to provide a pulse width modulated signal, a signal input for receiving the input signal, a signal output for providing the pulse width modulated signal, a reference input for receiving the periodic reference signal, a feedback loop between the signal output and the signal input, and a loop filter, wherein the modulation circuit is designed to switch over the pulse width modulated signal from the second voltage level to the first voltage level at least once at a fixed moment in every cycle of the reference signal, and wherein the modulation circuit is further designed to receive a correction signal for compensation of the switch-over of the pulse width modulated signal effected at said fixed moment in every cycle.

BRIEF DESCRIPTION OF THE FIGURES

The invention will be described in more detail below with reference to some specific embodiments thereof and to the appended drawings, in which.

DETAILED DESCRIPTION OF THE PREFERRED EMBODIMENTS

Figure 1:
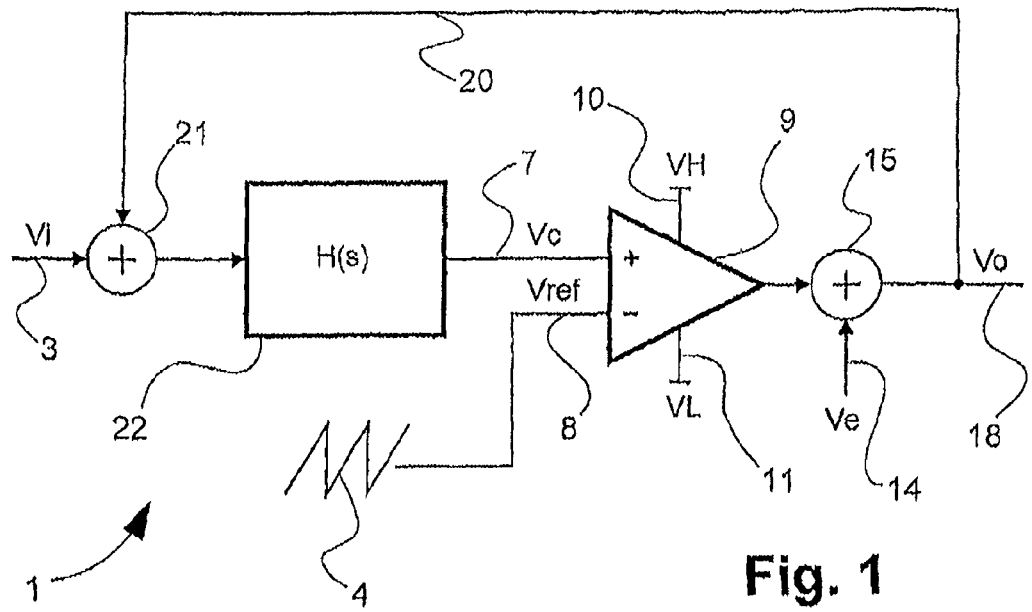
FIG. 1 is a diagram of a pulse width modulation circuit according to the prior art.

Identical or equivalent components or units have been given the same reference numerals as much as possible in the various figures. The figures can thus be readily compared with one another.

Figure 2:
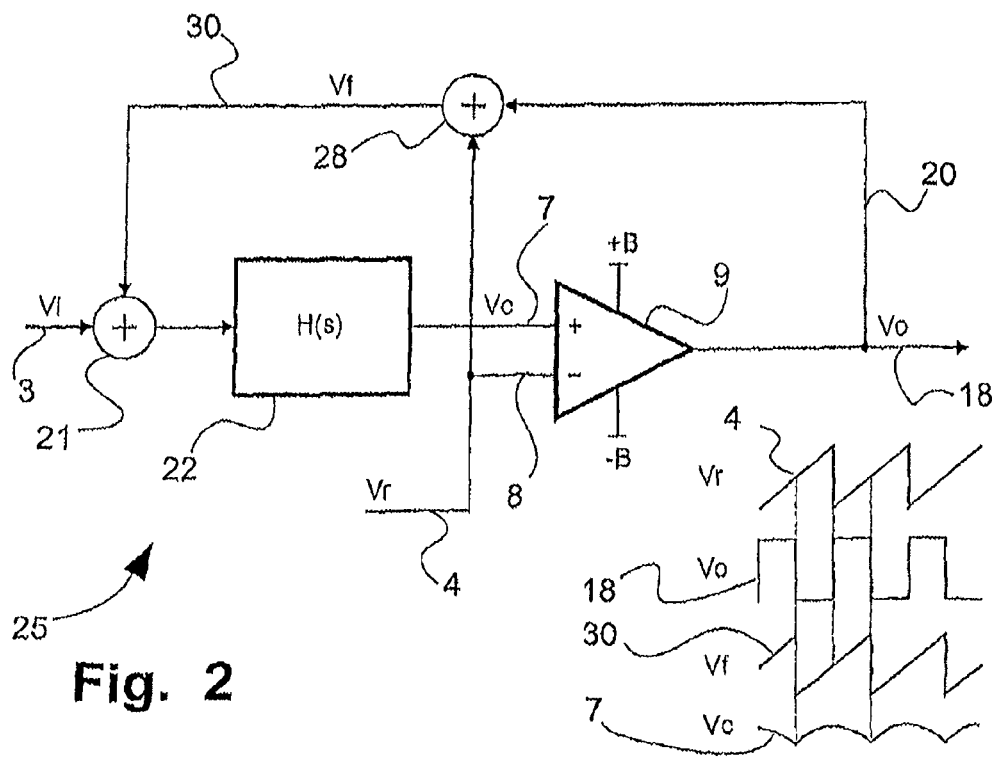
FIG. 2 schematically shows the operating principle of a method and circuit for pulse width modulation according to the invention.

FIG. 2 shows a circuit 25 comprising a signal input 3 to which an input signal Vi is applied so as to enter the circuit. The input signal Vi, which is a component part of the signal Vc (explained in more detail further below), is offered to the switched amplifier unit 9 via an input 7 of the switched amplifier unit 9. A reference signal Vr, which enters the circuit through a reference signal input 4, is applied to the inverted input 8 of the switched amplifier unit 9. A pulse width modulated signal Vo will now be produced at the output of the switched amplifier unit 9 and will be passed on to an output 18. Those skilled in the art will understand that the circuit of FIG. 2 represents an idealised circuit. An output filter and possible other components have not been depicted so as to clarify the working principle of the invention.

The output signal Vo is fed back via a feedback loop 20 to the input 3 of the circuit, where it is added to the input signal Vi in an adder unit 21. The periodic reference signal 4 in FIG. 2 is a sawtooth signal. The sawtooth waveform was chosen for the reference signal because it has one sharp edge in each cycle, so that at least one of the switch-over points from the one voltage level to the other voltage level in the pulse width modulated signal Vo 18 will coincide with the sharp edge in the reference signal 4. The location of the other switch-over point in the pulse width modulated signal is determined by the relative voltage value of the signal Vc offered to the input 7 of the switched amplifier unit 9 with respect to the voltage value of the reference signal Vr 4 at input 8. The signal Vc at input 7 is composed of the input signal Vi to which a feedback signal has been added via the feedback loop 20. This composite signal is filtered by means of a loop filter 22, usually an integrating filter, so as to provide the signal Vc to input 7 of the amplifier unit 9.

According to the invention, the behaviour of the feedback loop 20 and the loop filter 22 is substantially improved in that the voltage switch-over from the first to the second voltage level in the pulse width modulated signal, arising from the fixed sharp edge in the reference signal Vr at input 4, is corrected by means of the correction signal. In other words, a voltage step of equal value but opposite direction is to be applied in the correction signal at the location of the switch-over point from the first to the second voltage level in the pulse width modulated signal Vo 18 so as to compensate for the former voltage step. The value of this corrective voltage step in the ideal case is accordingly equal to the difference in voltage between the first and the second voltage level of the pulse width modulated signal Vo 18.

Since the voltage step coincides with the sharp edge in the reference signal each time, and in addition has the same frequency, the correction signal may simply be based on the original reference signal Vr 4. This is schematically indicated in FIG. 2 in that the reference signal Vr applied to the inverted input 8 of the switched amplifier unit 9 is at the same time added as a correction signal to the feedback signal in the feedback loop 20 by the adder unit 28 so as to provide a composite signal Vf. It is assumed here for the purpose of clarifying the operating principle that the step size of the voltage step in the pulse width modulated signal Vo is equal to the step size of the sharp edges in the reference signal Vr 4, so that the rising steps in Vo 18 are fully compensated by the falling steps in Vr 4.

The composite signal Vf, consisting of the fed-back signal equal to Vo and the correction signal based on Vr, is now added as a feedback signal to the signal Vi coming in at input 3 by the adder unit 21. This signal is subsequently filtered in the loop filter 22. The signal thus provided to the input 7 of the switched amplifier unit 9, i.e. signal Vc, has a waveform as shown in the right-hand bottom of FIG. 2. As a result of this operation, a difference in coefficient of direction of the signal Vc relative to the inverted reference signal Vr at the area of the point of intersection of the two signals on the sloping edge of the reference signal Vr is constant each time. A very linear feedback rule is created thereby. In addition, the high-frequency component of the obtained composite signal Vf+Vi is substantially not variable owing to the removal of the fixed edges in the pulse width modulated signal Vo 18, which coincide with the sharp edges of the reference signal Vr 4. As a result, there is hardly any intermodulation between the reference signal and this high-frequency component of the composite signal Vf+Vi in the amplifier unit 9, so that few low-frequency disturbances will occur. The quality of the pulse width modulated output signal Vo 18 is considerably enhanced by the correction signal thus offered.

Figure 3:
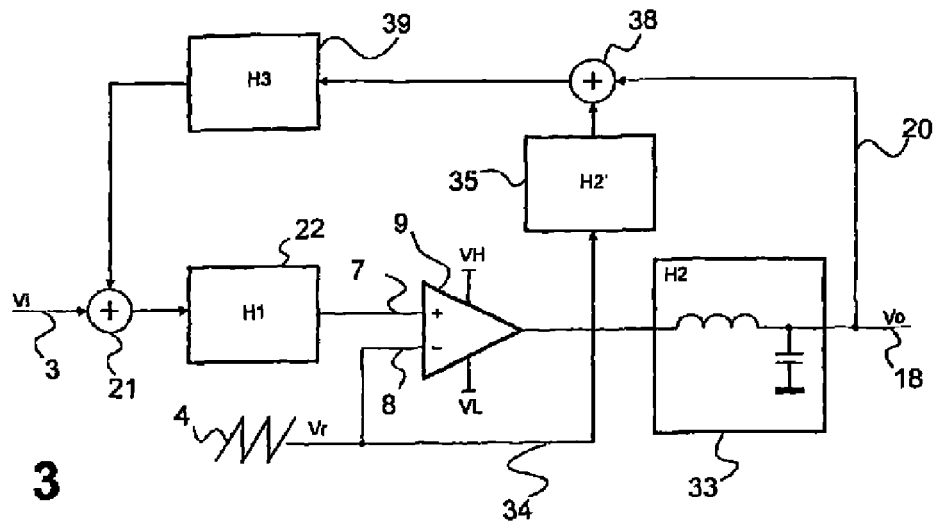
FIG. 3 shows a possible embodiment of an implementation of a method according to the invention in a pulse width modulation circuit according to the invention.

The situation outlined in FIG. 2 is an ideal situation where no account has been taken of transfer functions of any other components that may be present either in the forward path or in the feedback path of the circuit. FIG. 3 shows an alternative embodiment of the invention in which an output filter 33 is schematically shown as being arranged between the switched amplifier unit 9 and the output 18 of the circuit. Said circuit further comprises a feedback filter 39, which is a filter component that is present only in the feedback path 20. The filter unit 22 is again the integrating filter that was also present in FIG. 2.

In the same way as in the embodiment shown in FIG. 2, the correction signal is added to the feedback signal in the feedback path 20. This takes place in the adder unit 38. Between the switched amplifier unit 9 and the output 18 of the circuit there is an output filter 33. As in the circuit of FIG. 2, the reference signal 4 is applied to the inverted input of the switched amplifier unit 9, while this same reference signal 4 is used in the non-inverted form as a basis for the correction signal 34 that is combined with the feedback signal in the adder unit 38. Before the correction signal is added to the feedback signal, however, it should be corrected for the transfer function of the output filter 33. A filter element 35 is added for this purpose, i.e. for compensating the correction signal for the effect the output filter 33 has on the output signal Vo at the output 18 of the circuit. If the voltage difference between VH and VL in the amplifier unit 9 deviates from the voltage step of the sharp edge of the correction signal, furthermore, the latter should be adapted to the voltage difference between VH and VL. Element 39 represents a transfer function of the feedback path 20, in particular usually a phase compensation.

In the adder unit 21, the feedback signal, combined with the correction signal and filtered with the transfer function H3 in the filter element 39, is now combined with the input signal at input 3 of the circuit and offered to the integrating filter 22 with transfer function H1. The output of the integrating filter 22 is connected to the input 7 of the switched amplifier unit 9 for providing the pulse width modulated signal at the output of the switched amplifier unit 9.

Figure 4:
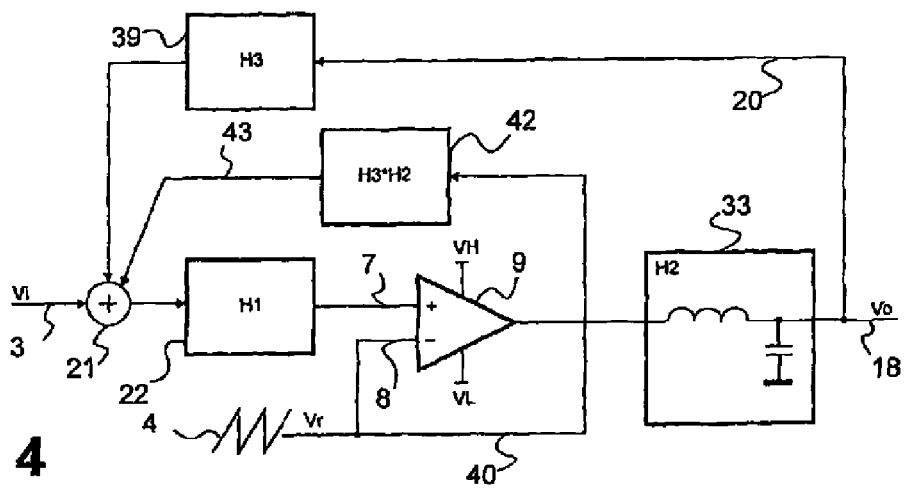
FIG. 4 shows a further implementation of a method according to the invention in a circuit for pulse width modulation according to the invention.

In the same manner as in the circuit of FIG. 3, the entry point of the correction signal in the circuit of FIG. 4 has been shifted to the adder unit 21. FIG. 4 again shows an input 3 to which an input signal Vi is applied, destined for a circuit for pulse width modulation. The input signal is compared, via the integrating filter and the input of the switched amplifier unit 9, with the reference signal present at the inverting input 8 of the switched amplifier unit so as to provide the pulse width modulated signal. The pulse width modulated signal of the amplifier unit 9 is filtered by the output filter 33 for providing the output signal Vo at the output 18 of the circuit. Said output signal Vo is fed back to the adder unit 21 via the feedback line 20. An element 39 present on the feedback line 20 represents the transfer function H3 of the feedback line 20. Before the correction signal can be added to the input signal via a line 40 and the adder unit 21, the correction signal should now first be compensated for the transfer functions H2 of the output filter 33 and H3 of the feedback filter 39. This is schematically indicated as a filter element 42. The input signal Vi coming from the input 3, the output signal Vo coming from the feedback line 20, and the correction signal are joined together on line 43 by the adder unit 21 and offered to the filter unit 22. The filter unit 22 usually is an integrating filter, and the output of this filter is passed on through the input 7 to the switched amplifier unit 9. In this switched amplifier unit 9 it is compared with the reference signal Vr present on the inverting input 8 for providing the pulse width modulated signal.

Figure 5:
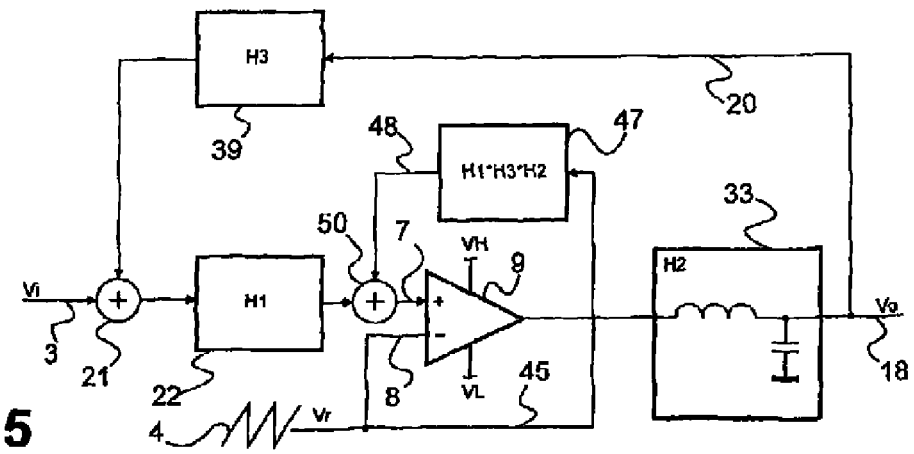
FIG. 5 shows a further embodiment of a method according to the invention implemented in a circuit for pulse width modulation according to the invention.

FIG. 5 shows a further modification of the circuit in which the correction signal, derived from the reference signal Vr at input 4 and offered to the inverting input 8 of the switched amplifier unit, is compensated via line 45 for the transfer functions of the output filter 33, the phase-compensating feedback filter 39, and the integrating filter 22. This is schematically indicated as a filter element 47 which represents the transfer functions H1, H2, and H3. Said correction signal is added via a line 48 and an adder unit 45 to the signal coming from the integrating filter 22 and is offered to the input 7 of the switched amplifier unit. The output signal Vo of the circuit has already been added, via line 20 and adder unit 50, to the input signal Vi coming in through input 3. The correction signal eventually added to the signal at the input 7 of the switched amplifier unit 9 via line 48 and adder unit 50 has thus been corrected for the transfer functions of all elements present in the circuits of FIG. 5.

Figure 6:
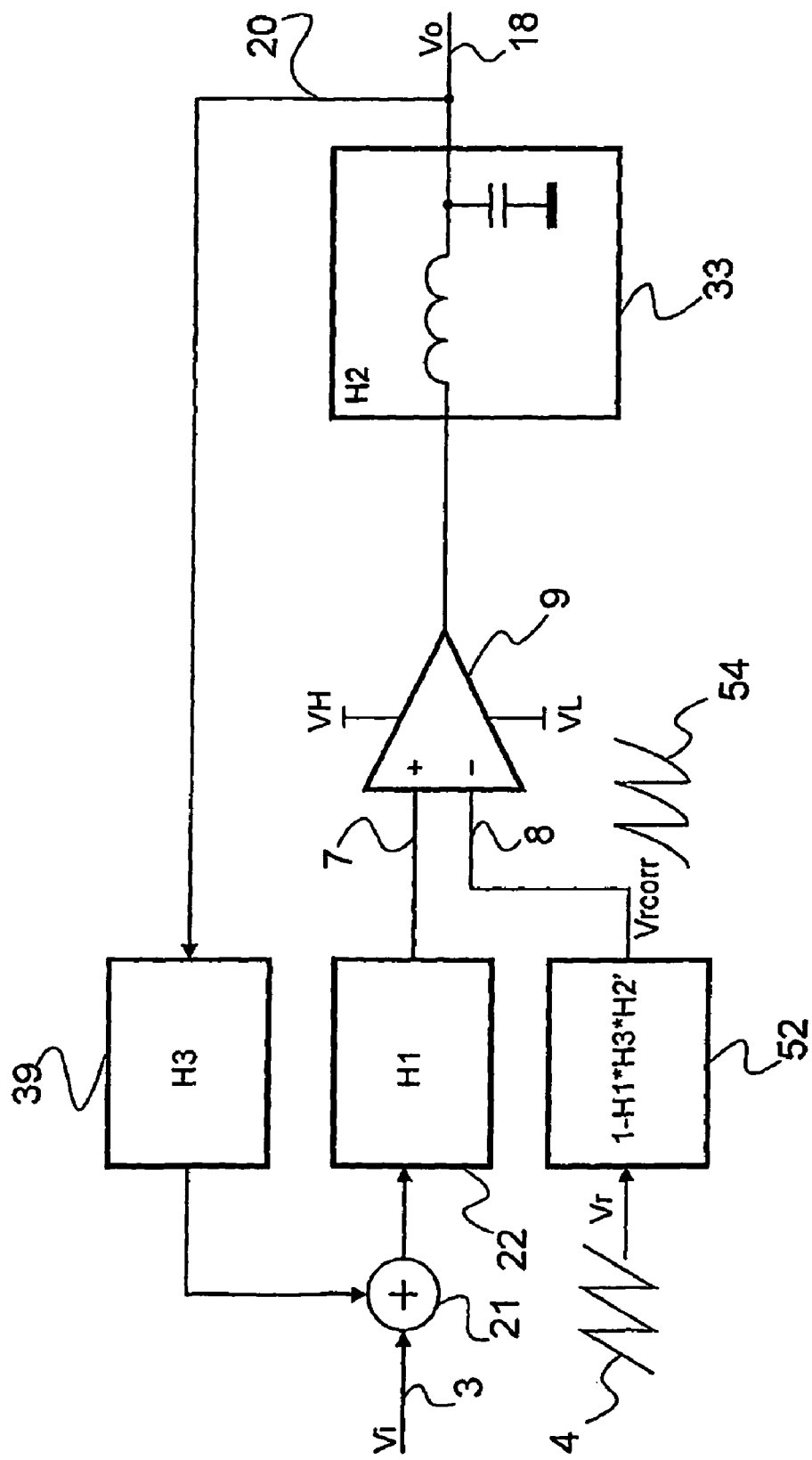
FIG. 6 shows a method and circuit according to the invention.

A special embodiment is the one shown in FIG. 6. The circuit of FIG. 6 again has an input 3 to which the input signal Vi for the circuit is applied. The signal is passed on via the integrating filter 22 with transfer function H1 and input 7 to the switched amplifier unit 9 for providing the pulse width modulated signal. The pulse width modulated signal issues from the switched amplifier unit 9 through an output filter with transfer function H2 to the output 18 of the circuit so as to provide the output signal Vo. The output signal Vo is fed back via line 20 and the phase-compensating feedback filter 39 with transfer function H3 to the input 3 of the circuit, where it is added to the input signal Vi in the adder unit 21.

The composite signal now passes through the integrating filter 22 with transfer function H1 to the input 7 of the switched amplifier unit 9. In this switched amplifier unit 9 the signal is compared with a reference signal for providing the pulse width modulated signal in the manner as described for the preceding embodiments.

The embodiment of FIG. 6 has the special feature that the correction signal, which was added via line 48 and adder unit 50 in FIG. 5 to the input 7 of the switched amplifier unit, has been shifted in the diagram to the inverting input 8 of the switched amplifier unit 9. This embodiment is based on the recognition that the correction signal may be added anywhere in the circuit for pulse width modulation, so also at the inverting input side, where normally only the reference signal is offered. This shift in fact amounts to a correction of the reference signal by means of the correction signal before the reference signal is applied to the switched amplifier unit 9 via its inverting input. The correction of the reference signal takes place by means of a filter unit 52 with transfer function $(1-H1*H3*H2')$. Mathematically, a correction signal equal to $(-H1*H3*H2')*Vr$ is added to the reference signal Vr (sawtooth) in the filter element 52 at the input 4 thereof. The signal Vrcorr thus obtained is in fact none other than the corrected reference signal, i.e. corrected for all transfer functions of the elements present in the circuit for pulse width modulation and in addition for the inversion at gate 8 of the amplifier unit 9. When this corrected reference signal Vrcorr is applied to the inverted input 8 of the switched amplifier unit 9, the same result is obtained as in the circuits of FIGS. 3, 4, and 5 above. The circuit thus obtained and the method of implementing pulse width modulation provide a particularly constant switching residue and is highly insensitive to the non-linearity of the integrating filter 22 of the circuit.

The circuits shown and discussed above, corrected by means of a correction signal, eliminate the non-linearity of the circuit and are very easy to implement.

Those skilled in the art will appreciate that, when adding the correction time, account should yet be taken of the propagation delay in the pulse width modulation stage. Phase differences should be taken into account in the addition of the correction terms at various points in the modulation stage.

Those skilled in the art will understand that the present invention can be implemented in many ways without departing from its operational principle and advantages. The scope of the present invention is accordingly only limited by the attached claims.

The invention claimed is:

1. A method of of providing a pulse width modulated signal based on an input signal and a reference signal, the reference signal being a periodical signal having a voltage step in each cycle, the method comprising:
    feeding back the pulse width modulated signal to the input signal thereby obtaining a composite signal,
    filtering the composite signal by means of a loop filter,
    switching over the pulse width modulated signal from a first voltage level to a second voltage level and from the second voltage level to the first voltage level in dependence on a comparison between the loop filtered composite signal and the reference signal
    wherein said method further comprising providing a correction signal based on the reference signal, wherein said correction signal is oppositely directed to the switch-over of the pulse width modulated signal associated with the voltage step in the reference signal;
    adding the correction signal to any one of the pulse width modulated signal, the fed back pulse width modulated signal, the loop filtered composite signal and the reference signal, so as to compensate at least in part for said switching over.

2. The method according to claim 1, wherein an amplitude of the periodic correction signal is attuned to a difference between the first voltage level and the second voltage level.

3. The method according to claim 1, wherein the reference signal comprises a saw tooth signal.

4. The method according to claim 1 further comprising compensating the correction signal for deformation caused by a transfer function of at least one filter in a circuit comprising the switching over, the feed back loop and the loop filter.

5. The method according to claim 4, wherein the circuit comprises an output filter, and the correction signal is compensated for deformation resulting from a transfer function of said output filter.

6. The method according to claim 4, wherein the correction signal is added in the feedback loop, and the correction signal is compensated for deformation resulting from a transfer function of the feedback loop.

7. The method according to claim 4, wherein the correction signal is added after the loop filter, and the correction signal is compensated for deformation resulting from a transfer function of the loop filter.

8. The method according to claim 1, wherein the correction signal is combined with the reference signal so as to provide a corrected reference signal.

9. The method according to claim 1, wherein the reference signal is a combination of a plurality of reference signal components, wherein the correction signal is a combination of a plurality of correction signal components, and wherein the number of reference signal components is equal to the number of correction signal components.

10. The method according to claim 1, further comprising using the reference signal as the correction signal.

11. A pulse width modulation circuit for providing a pulse width modulated signal comprising:

a switched amplifier unit for switching the pulse width modulated signal over between a first and a second voltage level and from the second voltage level to the first voltage level to the first voltage level on the basis of a comparison of a loop filtered composite signal with a periodic reference signal having a voltage step in each cycle, so as to provide the pulse width modulated signal, a signal input for receiving the input signal, a signal output for outputting the pulse width modulated signal, a reference input for receiving the periodic reference signal, a feedback loop between the signal output and the signal input;

means for obtaining the composite signal from the input voltage and the fed back pulse width modulated signal, a loop filter for filtering the composite signal to the composite loop filtered signal, means for providing a correction signal based on the reference signal, wherein said correction signal is oppositely directed to the switch-over of the pulse width modulated signal associated with the voltage step in the reference signal; and an adder for adding the correction signal to any one of the pulse width modulated signal, the fed back pulse width modulated signal, the composite signal, the loop filtered composite signal and the reference signal for compensation of the switch-over of the pulse width modulated signal.

12. The pulse width modulation circuit according to claim 11, wherein the reference signal is a saw tooth signal.

* * * * *